United States Patent
Park et al.

(10) Patent No.: US 10,355,216 B2
(45) Date of Patent: Jul. 16, 2019

(54) METHOD OF SELECTIVE SEPARATION OF SEMICONDUCTING CARBON NANOTUBES, DISPERSION OF SEMICONDUCTING CARBON NANOTUBES, AND ELECTRONIC DEVICE INCLUDING CARBON NANOTUBES SEPARATED BY USING THE METHOD

(71) Applicants: Samsung Electronics Co., Ltd., Suwon-si, Gyeonggi-do (KR); THE BOARD OF TRUSTEES OF THE LELAND STANFORD JUNIOR UNIVERSITY, Stanford, CA (US)

(72) Inventors: Young-jun Park, Suwon-si (KR); Jong-min Kim, Yongin-si (KR); Hang-woo Lee, Stanford, CA (US); Zhenan Bao, Stanford, CA (US)

(73) Assignees: Samsung Electronics Co., Ltd., Gyeonggi-do (KR); The Board of Trustees of the Leland Stanford Jr. University, Palo Alto, CA (US)

( * ) Notice: Subject to any disclaimer, the term of this patent is extended or adjusted under 35 U.S.C. 154(b) by 0 days.

(21) Appl. No.: 15/290,568

(22) Filed: Oct. 11, 2016

(65) Prior Publication Data
US 2017/0033292 A1 Feb. 2, 2017

Related U.S. Application Data

(62) Division of application No. 13/282,783, filed on Oct. 27, 2011, now Pat. No. 9,502,152.
(Continued)

(51) Int. Cl.
*H01B 1/00* (2006.01)
*H01L 51/00* (2006.01)
(Continued)

(52) U.S. Cl.
CPC .......... *H01L 51/0048* (2013.01); *B82Y 10/00* (2013.01); *B82Y 30/00* (2013.01);
(Continued)

(58) Field of Classification Search
CPC . H01B 1/00; H01B 1/127; H01B 1/14; H01B 1/20; C09D 5/24
See application file for complete search history.

(56) References Cited

U.S. PATENT DOCUMENTS

| 7,226,818 B2 | 6/2007 | Malenfant et al. |
| 7,247,670 B2 | 7/2007 | Malenfant et al. |

(Continued)

FOREIGN PATENT DOCUMENTS

| JP | 2006-265035 A | 10/2006 |
| JP | 2007-031238 A | 2/2007 |

(Continued)

OTHER PUBLICATIONS

Landi et al "Single-wall carbon nanotube-polymer solar cells", Progress in Photovoltaics: Research and Applications: Res. Appl. 2005; 13; 165-172. (Year: 2005).*

(Continued)

*Primary Examiner* — Mark Kopec
(74) *Attorney, Agent, or Firm* — Harness, Dickey & Pierce, P.L.C.

(57) ABSTRACT

According to example embodiments, a method includes dispersing carbon nanotubes in a mixed solution containing a solvent, the carbon nanotubes, and a dispersant, the carbon nanotubes including semiconducting carbon nanotubes, the dispersant comprising a polythiophene derivative including a thiophene ring and a hydrocarbon sidechain linked to the thiophene ring. The hydrocarbon sidechain includes an alkyl group containing a carbon number of 7 or greater. The hydrocarbon sidechain may be regioregularly arranged, and (Continued)

the semiconducting carbon nanotubes are selectively separated from the mixed solution. An electronic device includes semiconducting carbon nanotubes and the foregoing described polythiophene derivative.

14 Claims, 11 Drawing Sheets
(3 of 11 Drawing Sheet(s) Filed in Color)

Related U.S. Application Data

(60) Provisional application No. 61/408,805, filed on Nov. 1, 2010.

(51) Int. Cl.

| | | |
|---|---|---|
| C01B 32/00 | (2017.01) | |
| H01B 1/24 | (2006.01) | |
| C09C 1/44 | (2006.01) | |
| H01B 1/12 | (2006.01) | |
| B82Y 10/00 | (2011.01) | |
| B82Y 30/00 | (2011.01) | |
| B82Y 40/00 | (2011.01) | |
| C08K 3/04 | (2006.01) | |
| C01B 32/172 | (2017.01) | |
| C01B 32/174 | (2017.01) | |
| H01L 29/06 | (2006.01) | |
| H01L 51/05 | (2006.01) | |
| H01L 51/42 | (2006.01) | |
| C08L 65/00 | (2006.01) | |
| H01L 51/10 | (2006.01) | |
| H01L 51/44 | (2006.01) | |

(52) U.S. Cl.
CPC ............ *B82Y 40/00* (2013.01); *C01B 32/172* (2017.08); *C01B 32/174* (2017.08); *C08K 3/04* (2013.01); *C09C 1/44* (2013.01); *H01B 1/127* (2013.01); *H01B 1/24* (2013.01); *H01L 51/0025* (2013.01); *H01L 51/0036* (2013.01); *C01B 2202/02* (2013.01); *C01B 2202/04* (2013.01); *C01B 2202/06* (2013.01); *C01B 2202/22* (2013.01); *C01B 2202/36* (2013.01); *C08G 2261/1412* (2013.01); *C08G 2261/212* (2013.01); *C08G 2261/3223* (2013.01); *C08G 2261/91* (2013.01); *C08L 65/00* (2013.01); *H01L 29/0673* (2013.01); *H01L 51/0096* (2013.01); *H01L 51/0516* (2013.01); *H01L 51/0541* (2013.01); *H01L 51/0545* (2013.01); *H01L 51/0558* (2013.01); *H01L 51/0566* (2013.01); *H01L 51/105* (2013.01); *H01L 51/424* (2013.01); *H01L 51/4253* (2013.01); *H01L 51/442* (2013.01); *Y02E 10/549* (2013.01); *Y10S 977/742* (2013.01); *Y10S 977/845* (2013.01); *Y10S 977/938* (2013.01); *Y10S 977/948* (2013.01)

(56) References Cited

U.S. PATENT DOCUMENTS

| | | | |
|---|---|---|---|
| 7,488,876 B2 | 2/2009 | Jung et al. | |
| 7,514,063 B1 | 4/2009 | Tulevski et al. | |
| 7,561,772 B2 | 7/2009 | Shtein et al. | |
| 7,638,706 B2 | 12/2009 | Jin et al. | |
| 7,854,862 B2 * | 12/2010 | Chochos ................ | B82Y 10/00 252/500 |
| 9,502,152 B2 * | 11/2016 | Park ....................... | B82Y 10/00 |
| 2006/0045838 A1 | 3/2006 | Lucien Malenfant et al. | |
| 2008/0066802 A1 | 3/2008 | Reddy | |
| 2009/0020732 A1 | 1/2009 | Shin et al. | |
| 2009/0085012 A1 | 4/2009 | Chochos et al. | |
| 2009/0232724 A1 | 9/2009 | Afzali-Ardakani et al. | |
| 2013/0119548 A1 * | 5/2013 | Avouris ................ | B82Y 10/00 257/762 |
| 2015/0107638 A1 | 4/2015 | Takahashi | |

FOREIGN PATENT DOCUMENTS

| | | |
|---|---|---|
| JP | 2008-238162 A | 10/2008 |
| KR | 20050077542 A | 8/2005 |
| KR | 20070042179 A | 4/2007 |
| KR | 10-2007-0098433 A | 10/2007 |
| KR | 10-2008-0104855 A | 12/2008 |
| KR | 20080111488 A | 12/2008 |

OTHER PUBLICATIONS

Huang et al "A generalized method for evaluating the metallic-to-semiconducting ratio . . . ", J. Phys. Chem. C, 2010, 114, 12095-12098. (Year: 2010).*
Wang et al "Macroelectronic Intergrated Circuits . . . ", ACNano 2010, vol. 4, No. 12, 7123-32. (Year: 2010).*
Dillon et al "A simple and complete purification of single wall carbon nanotube materials", Adv. Mater. 1999, 11, No. 16, pp. 1354-1358. (Year: 1999).*
NanoIntegris semiconducting SWNT nanotubes (Isonanotubes-S) product description (http:nanointegris.com) (No date).*
Tanaka et al "High-yield separation of metallic and semiconducting single-wall carbon nanotubes . . . ", Applied Physics Express 1 (2008) 114001 (Year: 2008).*
Tanaka et al "Simple and scalable gel-based separation of of metallic and semiconducting single-wall carbon nanotubes", NanoLetters 2009 vol. 9, No. 4, 1497-1500. (Year: 2009).*
Nougaret et al "80 GHz field-effect transistors produced using high purity semiconducting single-wall carbon nanotubes", Applied Physics Letters 94, 243505 (2009). (Year: 2009).*
Japanese Office Action for corresponding Japanese Application No. 2013-536538 dated Jun. 23, 2014.
Arnold, et al. "Sorting carbon nanotubes by electronic structure using density differentiation", Nature Nanotechnology, vol. 1, pp. 60-65 (2006).
Tu, et al. "DNA sequence motifs for structure-specific recognition and separation of carbon nanotubes", Nature Letters, vol. 460, pp. 250-253 (2009).
Supplementary European Search Report from corresponding European Patent Application No. 11838206.8, dated Oct. 20, 2015.
Lee, Hang Woo, et al., Selective Dispersion of High Purity Semiconducting Single-Walled Carbon Nanotubes with Regioregular Poly (3-alkylthiophene)s, Nature Communications, vol. 2, Nov. 15, 2011, pp. 541-548.
International Search Report dated May 31, 2012.
Holt, et al. "Prolonging charge separation in P3HT-SWNT composites using highly enriched semiconducting nanotubes," Nano Lett. vol. 10, pp. 4627-4633 (2010).
Koizhaiganova, et al. "Double-wall carbon nanotubs (DWCNT)-poly(3-octylthiophene)(P3OT) composites . . . " Synthetic Metals, vol. 159, pp. 2437-2442 (2009).
Chang, et al. "Influence of solvent on the dispersion of single-walled carbon nanotubes in polymer matrix . . . ," J. Phys. Chem. C, vol. 114, pp. 10932-10936 (2010).
Hellstrom et al. "Polymer-assisted direct deposition of uniform carbon nanotube bundle networks . . . ," ACNANO, vol. 3, No. 6, pp. 1423-1430 (2009).
Kymakis, et al. "Effective mobility and photocurrent in carbon nanotube-polymer composite photovoltaic cells," Nanotechnology, vol. 18, pp. 435702 (6 pages), (2007).
Stefopoulos, et al. "Novel hybrid materials consisting of regoregular poly(3-octlthiophene)s covalently attached to single-wall carbon nanotubes," Chem. Eur. J. vol. 14, pp. 8715-8724 (2008).
Garai, et al. "Physical and electronic properties in multiwalled carbon nanotube-poly(3-dodecylthiophene) nanocomposites," Journal of Polymer Science: Part B: Polymer Physics, pp. 1412-1425 (2009).

(56) References Cited

OTHER PUBLICATIONS

Korean Office Action dated Jan. 10, 2018 issued in corresponding Korean Patent Application No. 10-2013-7007233 (English translation provided).

* cited by examiner

METHOD OF SELECTIVE SEPARATION OF SEMICONDUCTING CARBON NANOTUBES, DISPERSION OF SEMICONDUCTING CARBON NANOTUBES, AND ELECTRONIC DEVICE INCLUDING CARBON NANOTUBES SEPARATED BY USING THE METHOD

CROSS-REFERENCE TO RELATED APPLICATION

This application is a Divisional of U.S. application Ser. No. 13/282,783 (now U.S. Pat. No. 9,502,152), filed on Oct. 27, 2011, which claims priority to the benefit of U.S. Provisional Patent Application No. 61/408,805, filed on Nov. 1, 2010, in the US Patent and Trademark Office, the entire contents of each of the above-referenced applications are hereby incorporated by reference.

BACKGROUND

1. Field

Example embodiments relate to a method of selectively separating semiconducting carbon nanotubes (CNTs) by using a polythiophene derivative, a dispersion of semiconducting CNTs, and/or an electronic device including semiconducting CNTs separated by the method.

2. Description of the Related Art

Carbon nanotubes (CNTs) may be anisotropic and may have various structures. For example, CNTs may be single-walled, multi-walled, or bundled. CNTs may have diameters of nanometers.

CNTs may have semiconductor or metallic characteristics according to a pattern in which hexagonal honeycomb-like rings of carbon atoms are coiled. CNTs may have different energy gaps according to their diameters. CNTs may have quasi-one-dimensional energy spectra and exhibit unique quantum effects.

CNTs may be used for various purposes and be sorted either metallic CNTs or semiconducting CNTs according to their uses.

For example, semiconducting CNTs may be used in thin film transistors, including thin film transistors operating at room temperature.

General methods of separating and/or purifying semiconducting CNTs may have low separation and/or purification yields and may require post-processes, for example, to remove additives. As a result, general methods of separating and/or purifying semiconducting CNTs can be difficult to apply in mass-scale production.

SUMMARY

Example embodiments relate to methods of selectively separating semiconducting carbon nanotubes (CNTs).

Example embodiments relate to CNT dispersions including a high-yield of semiconducting CNTs.

Example embodiments relate to electronic devices including semiconducting CNTs separated by using the foregoing methods.

According to example embodiments, a method includes: dispersing carbon nanotubes in a mixed solution containing a solvent, the carbon nanotubes, and a dispersant, the carbon nanotubes including semiconducting carbon nanotubes. The dispersant may include a polythiophene derivative including a thiophene ring and a hydrocarbon sidechain linked to the thiophene ring, wherein the hydrocarbon sidechain includes an alkyl group containing a carbon number of 7 or greater, and the hydrocarbon sidechain being regioregularly arranged, and selectively separating the semiconducting carbon nanotubes from the mixed solution.

The polythiophene derivative may be represented by Formula 1 below:

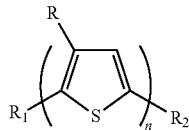

Formula 1 wherein R is a C7 to C50 alkyl group or a C8 to C50 alkyl group;

R1 and R2 are each independently one of hydrogen, halogen, methyl, and halomethyl; and n is an integer greater than 1 and less than or equal to 40,000, and/or an integer greater than 1 and less than or equal to 10,000.

The polythiophene derivative may be represented by one of Formulae 2, 3, and 4 below:

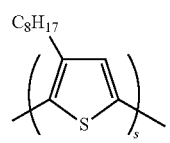

Formula 2

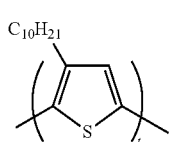

Formula 3

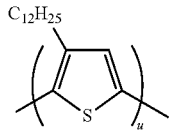

Formula 4 wherein s, t, and u are each independently an integer greater than 1 and less than or equal 40,000.

The polythiophene derivative may be represented by one of Formulae 5, 6, and 7 below:

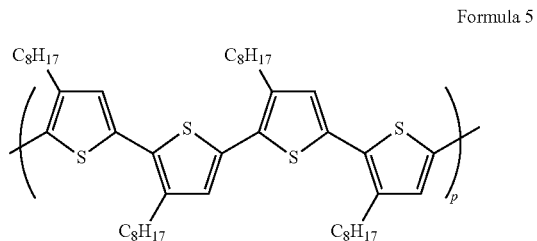

Formula 5

-continued

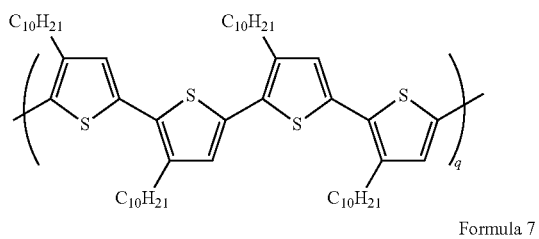

Formula 6

Formula 7 wherein p, q, and r are each independently an integer from 1 to 10,000.

The carbon nanotubes may have a diameter of 3 nm or less.

The carbon nanotubes may have a diameter of about 0.7 nm to about 3 nm.

The carbon nanotubes may include single-walled carbon nanotubes, double-walled carbon nanotubes, multi-walled carbon nanotubes, and bundled carbon nanotubes or combinations thereof.

The solvent may be an organic solvent.

The carbon nanotubes may have a solubility of less than about 10 mg/L in the organic solvent.

The organic solvent may include at least one of chloroform, dichloroethane, toluene, xylene, decalin, mesitylene, hexane, and tetrahydrofuran.

The mixed solution may include a weight ratio of dispersant to carbon nanotubes of about 10:1 to about 1:10.

An amount of the dispersant in the mixed solution may be from about 0.1 mg/ml to about 1 mg/ml, based on a total volume of the solvent.

The dispersing the carbon nanotubes in the mixed solution may be performed at a temperature of about −40° C. to about 90° C.

The dispersing the carbon nanotubes in the mixed solution may be performed at a temperature of about −20° C. to about 90° C.

The dispersing the carbon nanotubes in the mixed solution may be performed at a temperature of about 20° C. to about 80° C.

The dispersing the carbon nanotubes in the mixed solution may be performed at a temperature of about 40° C. to about 70° C.

The selectively separating the semiconducting carbon nanotubes from the mixed solution may include separating a supernatant containing the dispersed semiconducting carbon nanotubes from the mixed solution by centrifugation.

An amount of the semiconducting carbon nanotubes in the supernatant may be 75 wt % or greater, based on the total weight of the carbon nanotubes in the supernatant.

An amount of the semiconducting carbon nanotubes in the supernatant may be 99 wt % or greater, based on the total weight of the carbon nanotubes in the supernatant.

An amount of the semiconducting carbon nanotubes in the supernatant may be 99.5 wt % or greater, based on the total weight of the carbon nanotubes in the supernatant.

An amount of the semiconducting carbon nanotubes in the supernatant may be 99.9 wt % or greater of the total carbon nanotubes.

The carbon nanotubes dispersed in the mixed solution may further include carbon nanotubes having metallic characteristics. The method may further include selectively separating the carbon nanotubes having metallic characteristics from the mixed solution.

According to example embodiments, an electronic device may include semiconducting carbon nanotubes, and a polythiophene derivative, wherein the polythiophene derivative includes a thiophene ring and a hydrocarbon sidechain linked to the thiophene ring and the hydrocarbon sidechain including an alkyl group containing a carbon number of 7 or greater, and the hydrocarbon sidechain being regioregularly arranged.

The polythiophene derivative may be represented by Formula 1 below:

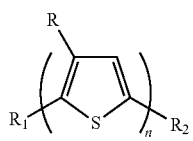

Formula 1 wherein R is a C7 to C50 alkyl group or a C8 to C50 alkyl group;

R1 and R2 are each independently one of hydrogen, halogen, methyl, and halomethyl; and n is an integer greater than 1 and less than or equal to 40,000, and/or an integer greater than 1 and less than or equal to 10,000.

The polythiophene derivative may be represented by one of Formulae 2, 3, and 4 below:

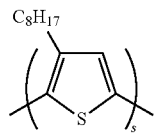

Formula 2

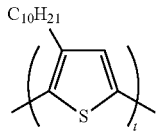

Formula 3

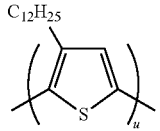

Formula 4 wherein s, t, and u are each independently an integer greater than 1 and less than or equal to 40,000.

The polythiophene derivative may be represented by one of Formulae 5, 6, and 7 below:

Formula 5

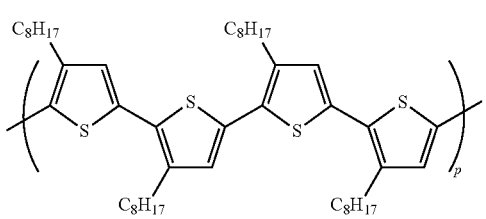

Formula 6

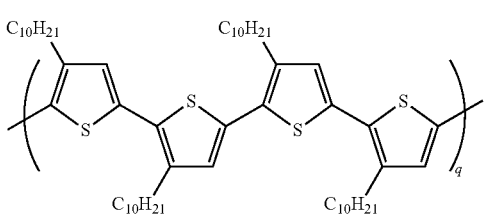

Formula 7

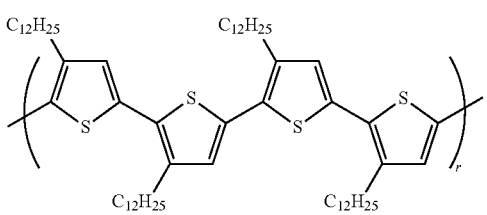

wherein p, q, and r are each independently an integer from 1 to 10,000.

An amount of the semiconducting carbon nanotubes may be 75 wt % or greater of the total amount of carbon nanotubes.

An amount of the semiconducting carbon nanotubes may be 99 wt % or greater of the total amount of carbon nanotubes.

An amount of the semiconducting carbon nanotubes may be 99.5 wt % or greater of the total amount of carbon nanotubes.

An amount of the semiconducting carbon nanotubes may be 99.9 wt % or greater of the total amount of carbon nanotubes.

The electronic device may include one of a transistor, a solar cell, a photodetector, a photoconductor, an electrode, and a flexible electronic device.

The electronic device may include a thin film transistor (TFT), wherein the thin film transistor has a hole mobility of 10 cm$^2$/Vs or greater and an on/off current ration of 10$^6$ or greater.

According to example embodiments, a dispersion includes a polythiophene derivative and carbon nanotubes, wherein the polythiophene derivative includes: a thiophene ring linked to an alkyl group, the alkyl group containing a carbon number of 7 or greater, and the alkyl group being regioregularly arranged.

The polythiophene derivative may be represented by Formula 1 below:

Formula 1

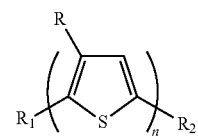

wherein R is a C7 to C50 alkyl group or a C8 to C50 alkyl group;

R1 and R2 are each independently one of hydrogen, halogen, methyl, and halomethyl; and n is an integer greater than 1 and less than or equal to 40,000, and/or an integer greater than 1 and less than or equal to 10,000.

The polythiophene derivative may be represented by one of Formulae 2, 3, and 4 below:

Formula 2

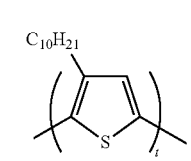

Formula 3

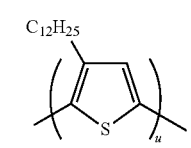

Formula 4

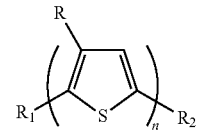

wherein s, t, and u are each independently an integer greater than 1 and less than or equal to 40,000.

The polythiophene derivative may be represented by one of Formulae 5, 6, and 7 below:

Formula 5

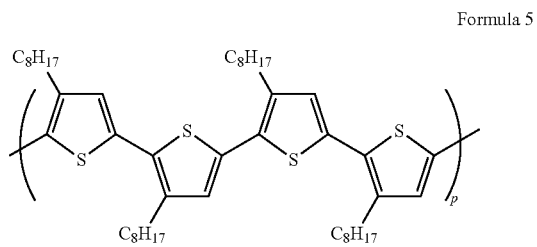

Formula 6

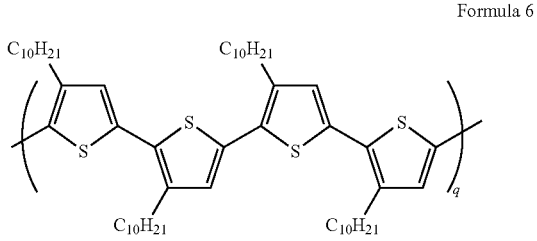

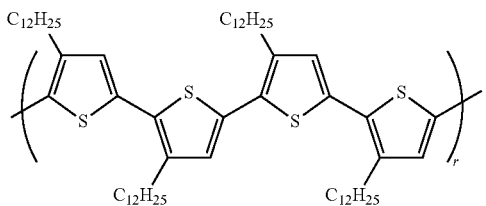

Formula 7 wherein p, q, and r are each independently an integer from 1 to 10,000.

The dispersion may include semiconducting carbon nanotubes, wherein an amount of the semiconducting carbon nanotubes may be 75 wt % or greater, based on a total weight of the carbon nanotubes.

An amount of the semiconducting carbon nanotubes may include 99 wt % or greater semiconducting carbon nanotubes.

An amount of the semiconducting carbon nanotubes may include 99.5 wt % or greater semiconducting carbon nanotubes.

An amount of the semiconducting carbon nanotubes may include 99.9 wt % or greater semiconducting carbon nanotubes.

Additional aspects will be set forth in part in the description which follows and, in part, will be apparent from the description, or may be learned by practice of example embodiments.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and/or other aspects of example embodiments will become apparent and more readily appreciated from the following description of the non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
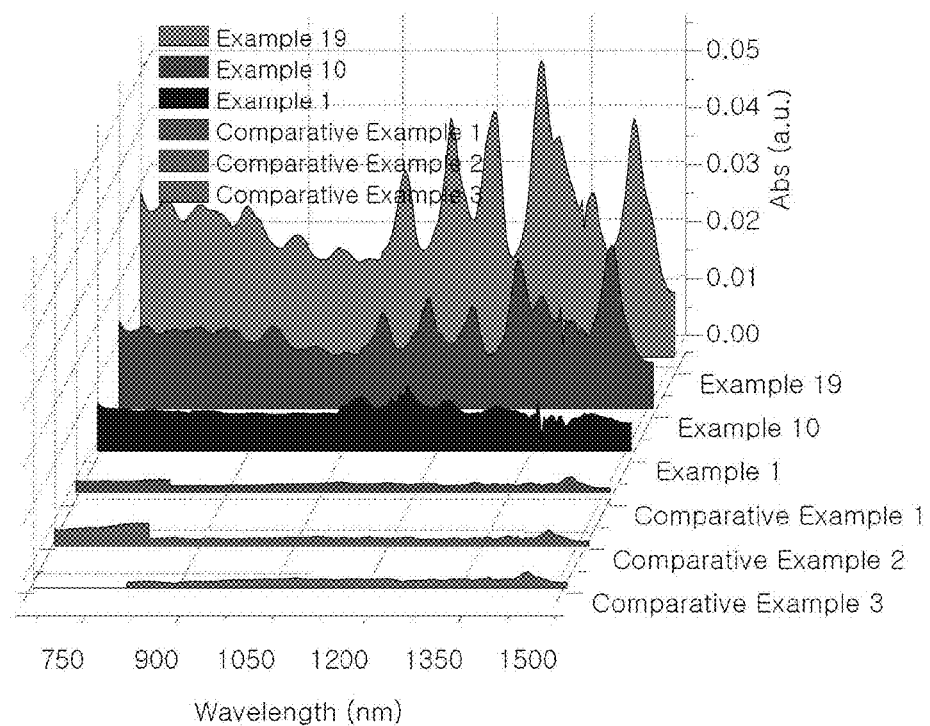
FIG. 1 is a 3-dimensional graph of ultraviolet-visible-near infrared (UV-Vis-NIR) absorption spectra of carbon nanotube (CNT) dispersions prepared in Examples 1, 10 and 19 and Comparative Examples 1 to 3.
Figure 2:
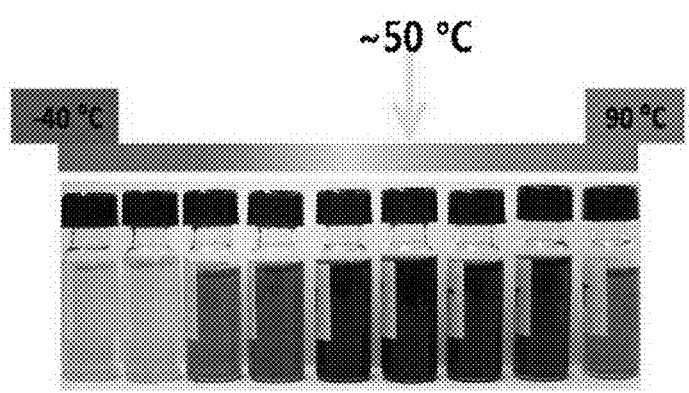
FIG. 2 is a photograph showing appearances of CNT dispersions prepared in Examples 19.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments, a method includes: dispersing CNTs in a mixed solution containing a solvent, the CNTs, and a dispersant, the CNTs including semiconducting CNTs, the dispersant comprising a polythiophene derivative including a thiophene ring and a hydrocarbon sidechain linked to the thiophene ring, wherein the hydrocarbon sidechain includes an alkyl group containing a carbon number of 7 or greater, and the hydrocarbon sidechain being regioregularly arranged, and selectively separating the semiconducting carbon nanotubes from the mixed solution. Functions of the polythiophene derivative that enables selective separation of semiconducting CNTs will be explained in more detail. However, this explanation is provided for the purpose of illustration and is not intended to limit the scope of example embodiments.

A polythiophene derivative is a conjugated polymer having a π-conjugated structure, in which π-electrons of a hydrocarbon group of the polythiophene derivative strongly interact with CNTs, i.e., $sp^2$ carbons of the CNTs, forming π-π bonds. The polythiophene derivative self-assembles into an interdigitated supramolecular structure of the hydrocarbon sidechain linked to the thiophene ring.

In the polythiophene derivative the hydrocarbon sidechain is regioregularly arranged to form the supramolecular structure with a specific surface arrangement that offers CNTs having specific physical characteristics that improves binding properties of CNTs having specific physical characteristics. Thus, by using the polythiophene derivative with such a regioregular arrangement of the hydrocarbon sidechain, semiconducting CNTs may be selectively separated with a high yield.

Being conductive, the polythiophene derivative enables selective separation of semiconducting CNTs with a high yield, without an additional process of separating, for example an insulating surfactant or an insulating polymer, which are used in general methods, from a CNT dispersion.

The term "regioregular arrangement" as used herein indicates that substituents in a repeating group including a thiophene ring and the hydrocarbon sidechain linked to the thiophene ring coordinated in a regioregular pattern by being substituted to specific binding sites of the thiophene ring. As opposed to the "regioregular arrangement", a regiorandom arrangement refers to substituents of the hydrocarbon sidechain that are at random sites of the thiophene ring, resulting in a random arrangement of the hydrocarbon sidechain in diverse directions.

A steric force of the hydrocarbon sidechain with such a regiorandom arrangement may tilt the hydrocarbon sidechain or thiophene ring, reducing the adsorption of the thiophene ring to CNTs.

According to example embodiments, the dispersant used in the method of selectively separating semiconducting CNTs may further include another dispersant, in addition to the polythiophene derivative, as long as it can improve the semiconducting CNT separation efficiency. Suitable dispersants include, polysaccharide (dextrin), polyethylenimine (PEI), polyvinylpyrrolidone (PVP), polyethyleneoxide (PEO), and tetraoctylammonium bromide (TOAB). Any suitable dispersant that is commonly used in the art may be used.

In addition to the dispersant, an additive that may improve the separation efficiency may be further used. An example of a suitable additive is ethylene diamine tetraacetic acid (EDTA). Any suitable additive that is commonly used in the art for this purpose may be used.

According to example embodiments, in preparing the mixed solution of the dispersant, the CNTs, and the solvent in the method described above, the dispersant and CNTs may be simultaneously or sequentially added to the solvent, irrespective of the order in which they are added.

According to example embodiments, the dispersing of the CNTs in the mixed solution may be performed using a sonicator, blender, or a mixer such as a mechanical mixer, but example embodiments are not limited thereto. Any suitable dispersing method may be used as long as it can prevent and/or substantially limit coagulation of the CNTs.

When a sonicator is used, the dispersing time may be from about 30 minutes to about 20 hours, or from about 30 minutes to about 10 hours, or from about 30 minutes to about 5 hours, but example embodiments are not limited thereto. An applied ultrasonic power may be from about 70% to about 75% of the maximum amplitude.

According to example embodiments, the selectively separating of semiconducting CNTs from the mixed solution in which the CNTs are dispersed may be performed by centrifugation. However, any suitable method that is commonly used in the art may be used. The centrifugation may be performed at about 21,000 G to about 25,000 G for about 0.5 hours to about 2 hours. The centrifugation may be performed in multiple steps while varying the speed from lower rates to higher rates. The centrifugation may be performed at about 13,000 rpm to about 17,000 rpm.

According to example embodiments, the polythiophene derivative may include at least ten repeating units. The polythiophene derivative including the repeating units as described above may make semiconducting carbon nanotubes wrapping enough to separate semiconducting carbon nanotubes very well According to example embodiments, the hydrocarbon sidechain may have a carbon number of 7 to 50, a carbon number of 7 to 30, and a carbon number of 10 to 30, but example embodiments are not limited thereto. When the carbon number of the hydrocarbon sidechain is within these ranges, the polythiophene derivative may self-assemble to form the supramolecular structure while maintaining flexibility.

The polythiophene derivative may be represented by Formula 0 below.

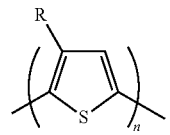

Formula 0 wherein n is an integer greater than 1 and less than or equal to 40,000. R may be an alkyl group containing a carbon number of 8 or greater. R may be a C8 to C50 alkyl group.

The polythiophene derivative may be represented by Formula 1 below.

Formula 1

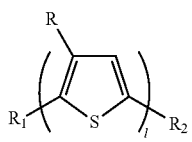

In Formula 1 above, R is one of a C7-C50 alkyl group, C8-C50 alkyl group, a C7-C30 alkyl group, a C10-C30 alkyl group, but example embodiments are not limited thereto. $R_1$ and $R_2$ are each independently any one selected from the group consisting of hydrogen, halogen, alkyl, methyl, halomethyl. Also, n is an integer greater than 1 and less than or equal to 40,000, and/or greater than 1 and less than or equal to 10,000.

The polythiophene derivative may be represented by one of Formulae 2 to 4 below:

Formula 2
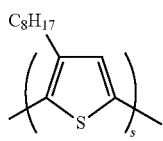

Formula 3
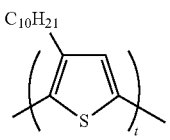

Formula 4
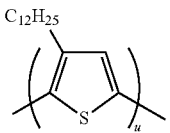

wherein s, t, and u are each independently an integer greater than 1 and less than or equal to 40,000.

The polythiophene derivative may be represented by one of Formulae 5 to 7 below:

Formula 5
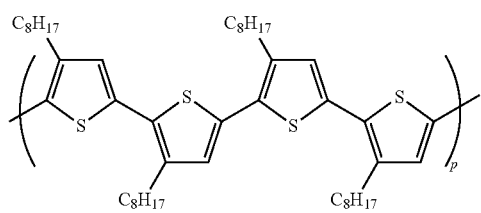

Formula 6
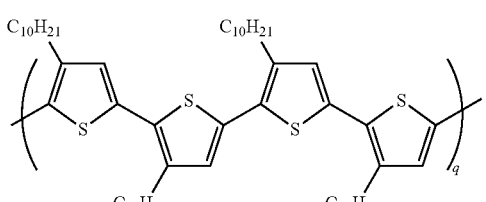

Formula 7
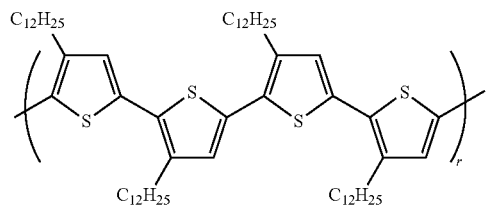

wherein p, q, and r are each independently an integer from 1 to 10,000.

The carbon nanotubes may have a diameter of 3 nm or less. The carbon nanotubes may have a diameter of about 0.7 nm to about 3 nm, a diameter of about 0.8 nm to about 3 nm, and a diameter of about 0.85 nm to about 3 nm, but example embodiments are not limited thereto.

When the diameter of the carbon nanotubes is within these ranges, the semiconducting carbon nanotubes may have selectivity, and the carbon nanotubes may improve a hole mobility and an on/off current ratio when used in an electronic device such as a thin film transistor. The carbon nanotubes in the mixed solution before the semiconducting carbon nanotubes are separated therefrom may include at least one kind of single-walled carbon nanotubes, double-walled carbon nanotubes, and bundled carbon nanotubes. However, the carbon nanotubes in the mixed solution may include any kind of carbon nanotubes used in the art. According to example embodiments, the carbon nanotubes in the mixed solution before the semiconducting carbon nanotubes are separated therefrom may include High-pressure CO (HiPCO) carbon nanotubes.

These carbon nanotubes may be synthesized using electric discharge, thermal decomposition, laser deposition, plasma-enhanced chemical vapor deposition, thermochemical vapor deposition, or electrolysis. However, any suitable method that is commonly used in the art to synthesize carbon nanotubes may be used.

In example embodiments, the solvent in the method of selective separation of the semiconducting carbon nanotubes comprises an organic solvent. However, any suitable solvent that is commonly used in the art may be used.

The carbon nanotubes may have a solubility of less than about 10 mg/L in the organic solvent, or a solubility of less than about 5 mg/L in the organic solvent, but example embodiments are not limited thereto.

Suitable organic solvents include: chloroform; dichloroethane; toluene; xylene; decalin; mesitylene; hexane; tetrahydrofuran. These organic solvents may be used individually or in combination of at least two.

A weight ratio of the dispersant to the carbon nanotubes in the mixed solution may be from about 10:1 to about 1:10, from about 3:1 to about 1:3, and from about 3:1 to about 0.75:1, but example embodiments are not limited thereto. When the mixing ratio of the dispersant to the carbon nanotubes is within these ranges, the carbon nanotubes may be more effectively dispersed, improving separation yield. In addition, an additional post-process may not be required for removing, for example, an insulating dispersant.

An amount of the dispersant in the mixed solution may be from about 0.1 mg/ml to about 1 mg/ml, based on a total volume of the solvent, and from about 0.05 mg/ml to about 1 mg/ml. An amount of the carbon nanotubes may be from about 0.01 mg/ml to about 1 mg/ml, based on a total volume of the solvent, and from about 0.005 mg/ml to about 1 mg/ml, but example embodiments are not limited thereto.

The dispersing of the carbon nanotubes in the mixed solution may be performed at a temperature of about −40° C. to about 90° C., and at a temperature of about −20° C. to about 90° C. For example, the dispersing of the carbon nanotubes in the mixed solution may be performed at a temperature of about 20° C. to about 80° C., and at a temperature of about 40° C. to about 70° C., but example embodiments are not limited thereto.

When the carbon nanotubes are dispersed within these temperature ranges, the hydrocarbon sidechain of the polythiophene derivative may melt and form the supramolecular structure while maintaining flexibility. Once the carbon nanotubes are dispersed, a steric structure of the polymer backbone may be controlled to have a desired regioregular arrangement that enables selective separation of the semiconducting carbon nanotubes.

The selectively separating of the semiconducting carbon nanotubes from the mixed solution may include separating a supernatant containing the dispersed semiconducting carbon nanotubes from the mixed solution by centrifugation. The supernatant may include only carbon nanotubes that are completely dispersed, excluding undistributed carbon nanotubes in powder or bundles that are precipitated by centrifugation.

According to example embodiments, an amount of the semiconducting carbon nanotubes in the supernatant may be 75 wt % or greater, based on the total weight of the carbon nanotubes, and/or 99 wt % or greater of semiconducting carbon nanotubes, and/or 99.5 wt % or greater of semiconducting carbon nanotubes, and/or 99.9 wt % or greater of semiconducting carbon nanotubes.

According to example embodiments a dispersion including metallic carbon nanotubes and semiconducting carbon nanotubes may be centrifuged at about 25,000 G for 2 hours to isolate a supernatant therefrom.

According to example embodiments, the rest of the dispersion excluding the supernatant may include 75 wt % or greater of the metallic carbon nanotubes based on the total weight of the residue, and/or 99 wt % or greater of the metallic carbon nanotubes based on the total weight of the residue, and/or 99.5 wt % or greater of the metallic carbon nanotubes based on the total weight of the residue, and and/or 99.9 wt % or greater of the metallic carbon nanotubes.

According to example embodiments, by the method of selective separation of semiconducting carbon nanotubes, metallic carbon nanotubes may also be selectively separated. The metallic carbon nanotubes may be used in an electrode and the electrode may be transparent and conductive, but example embodiments are not limited thereto.

According to example embodiments, an electronic device includes semiconducting carbon nanotubes, and a polythiophene derivative, wherein the polythiophene derivative includes a thiophene ring and a hydrocarbon sidechain linked to the thiophene ring, the hydrocarbon sidechain including an alkyl group containing a carbon number of 7 or greater, and the hydrocarbon sidechain being regioregularly arranged.

The semiconducting carbon nanotubes can be used as a charge generation and also as charge transport by the characteristics of the semiconducting carbon nanotubes.

The polythiophene derivative may self-assemble to form an interdigitated supramolecular structure of the hydrocarbon sidechain linked to the thiophene ring, which is a conjugated polymer structure for selectively dispersing carbon nanotubes. Thus, without an additional process for removing a surfactant or the used polymer, it may be used as an electron donor. Further, the electron device can include selectively separated semiconducting carbon nanotubes with a high yield.

The polythiophene derivative may be represented by Formula 1 below.

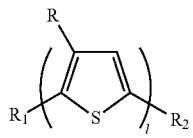

Formula 1

In Formula 1 above, R is one of a C7-C50 alkyl group, a C7-C30 alkyl group, a C10-C30 alkyl group, but example embodiments are not limited thereto.

$R_1$ and $R_2$ are each independently one of hydrogen, halogen, alkyl, methyl, halomethyl. Also, n is an integer greater than 1 and less than or equal to 40,000, and/or greater than 1 and less than or equal to 10,000.

The polythiophene derivative may be represented by one of Formulae 2 to 4 below:

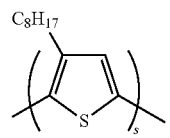

Formula 2

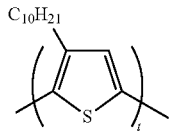

Formula 3

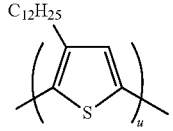

Formula 4 wherein s, t, and u are each independently an integer greater than 1 and less than or equal to 40,000.

The polythiophene derivative may be represented by one of Formulae 5 to 7 below:

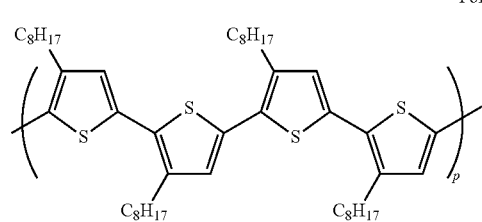

Formula 5

-continued

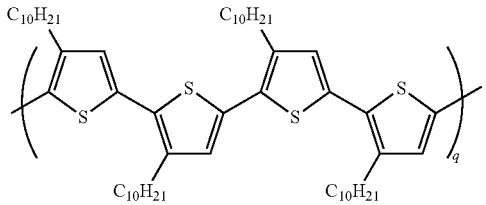

Formula 6

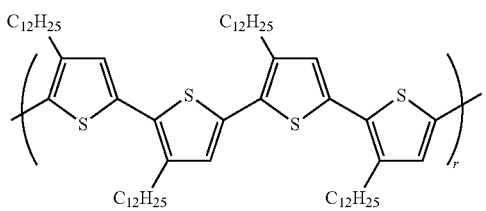

Formula 7 wherein p, q, and r are each independently an integer from 1 to 10,000

In the electronic device including the semiconducting carbon nanotubes, an amount of the semiconducting carbon nanotubes may be 75 wt % or greater of the total amount of carbon nanotubes, 99 wt % or greater, 99.5 wt % or greater, and 99.9 wt % or greater, but example embodiments are not limited thereto.

The electronic device may include a transistor, a solar cell, a photodetector, a photoconductor, an electrode, or a flexible electronic device. According to example embodiments, the electronic device may be a thin film transistor (TFT).

Figure 8A:
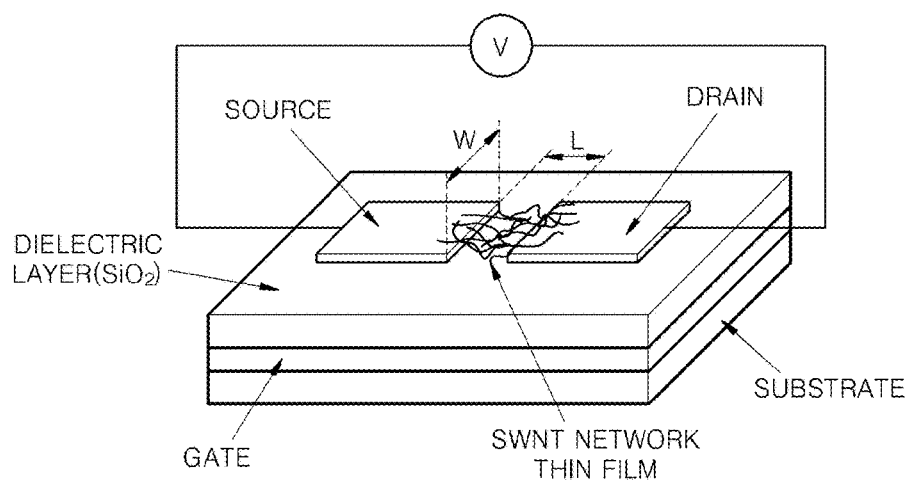
FIG. 8A is a schematic view of a thin film transistor (TFT) manufactured using semiconducting CNTs separated from the CNT dispersion prepared in Example 19
Figure 8B:
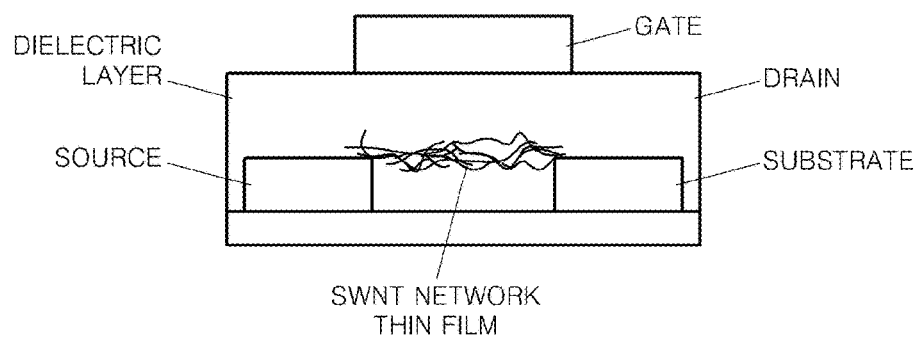
FIG. 8B is a schematic view of a thin film transistor (TFT) according to example embodiments.

FIGS. 8A and 8B illustrate thin film transistors (TFTs) according to example embodiments. Referring to FIGS. 8A and 8B, TFTs according to example embodiments may include a substrate, a gate electrode, an insulating layer such as a dielectric layer, source and drain electrodes separated from each other, and a semiconductor channel connecting the source and drain electrodes.

Referring to FIG. 8A, a TFT may include the channel, source and drain electrodes, and insulating layer on the gate electrode, and the gate electrode on the substrate. Referring to FIG. 8B, a TFT may include source and drain electrodes on the substrate, a channel connecting the source and drain electrodes, a dielectric layer on the channel, and a gate electrode on the channel layer.

The substrate may include a material selected from among various non-conductive polymers, such as silicon, glass, fused silica, quartz, plastics, polydimethylsiloxane (PDMS), and combinations thereof, but example embodiments are not limited thereto.

The insulating layer may include an electrically insulating material. Suitable electrically insulating materials include silicon dioxide ($SiO_2$), silicon nitride ($Si_3N_4$), Teflon, polydimethylmethacrylate, and polymethylmethacrylate (PMMA), but example embodiments are not limited thereto. The insulating layer may be disposed under or above the semiconductor channel, or on a side of the semiconductor channel.

The source and drain electrodes may each include gold (Au), silver (Ag), titanium (Ti), or platinum (Pt), but example embodiments are not limited thereto.

The semiconductor channel may include high-purity semiconducting carbon nanotubes separated by using the method described above.

The thin film transistor including the semiconducting carbon nanotubes may have a high hole mobility and a high on/off current ratio, without performing an additional post-process or thermal treatment.

According to example embodiments, the thin film transistor may have a hole mobility of 10 $cm^2$/Vs or greater, and an on/off current ratio of $10^6$ or greater.

Figure 9:
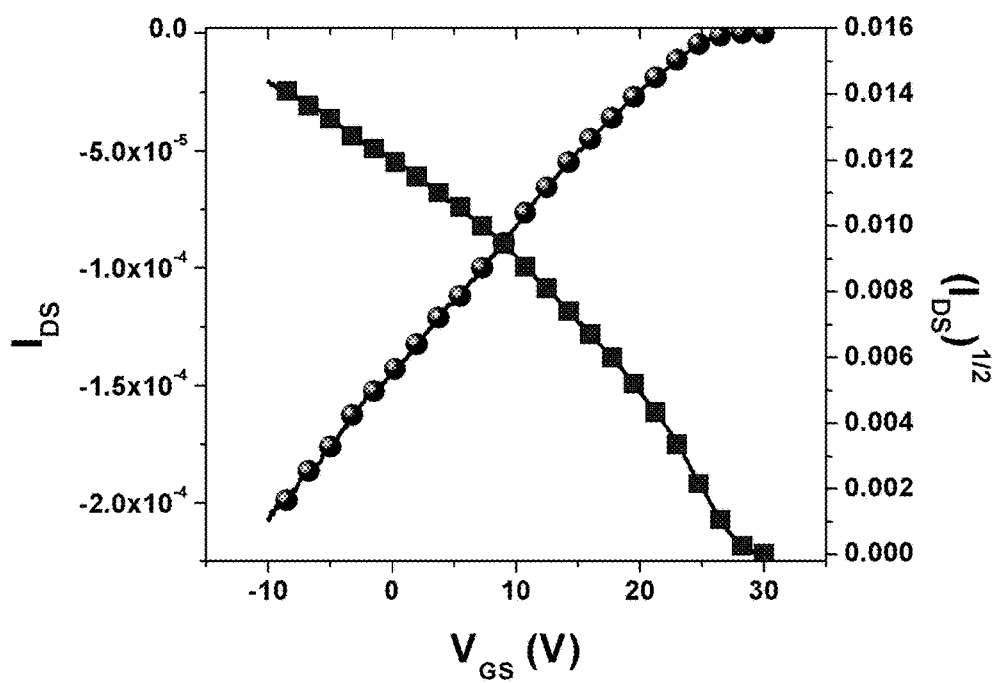
FIG. 9 is a graph of $V_{GS}$ of a TFT of Example 19 with respect to $I_{DS}$.
Figure 10:
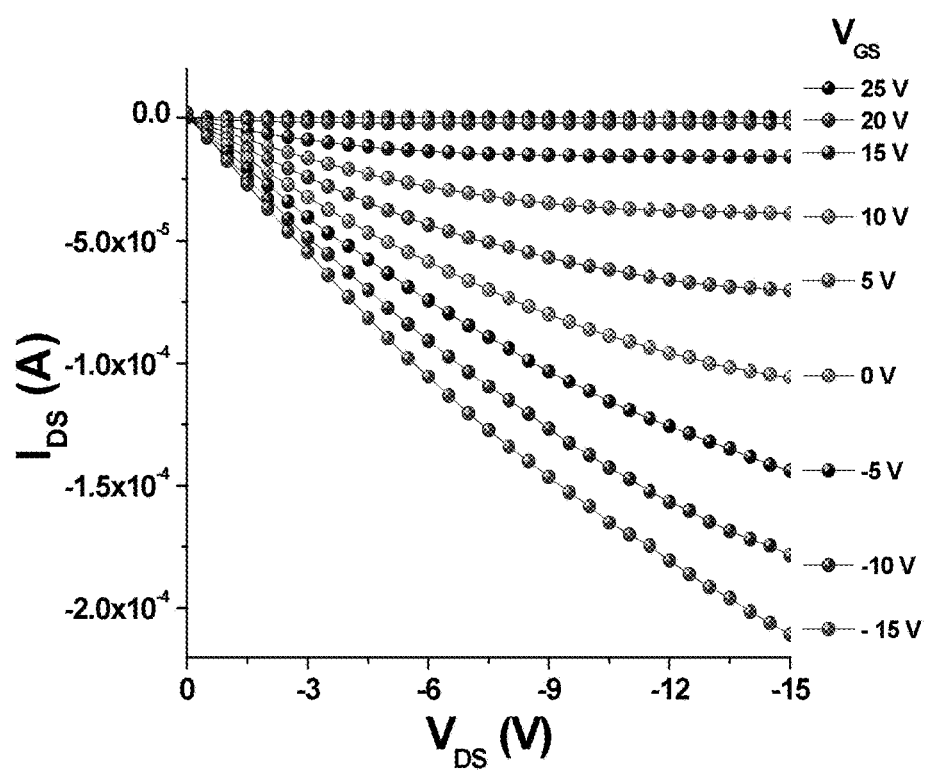
FIG. 10 is a graph illustrating output curves of a TFT of Example 19.

FIG. 9 illustrate a graph of $V_{GS}$ of a TFT of Example 19 with respect to $I_{DS}$. FIG. 10 is a graph illustrating output curves of a TFT of Example 19.

The hole mobility can be simply described at linear region in FIGS. 9 and 10 as follows:

$$\mu = \frac{I_{DS}}{V_{GS}} \frac{L}{W} \frac{1}{V_{DS}} \frac{1}{C_i}$$

where $\mu$ is a hole mobility and $C_i$ is a gate insulator capacitance per unit area, and L, W are the length and width of the channel. The $C_i$, L and W come from the thin film transistor. $I_{DS}$, $V_{GS}$ and $V_{DS}$ are shown in FIGS. 9 and 10.

Referring to FIG. 10, $I_{DS}$ is around zero when $V_{GS}$ is 20V or greater. It means a 'switched-off'. $I_{DS}$ is decreased when $V_{GS}$ is decreased. In other words, the absolute value of $I_{DS}$ is increased when $V_{GS}$ is decreased. It represents a 'switched-on' with a resistance of the thin film transistor.

The on/off current ratio is a switched-on/switched-off current ratio. The on/off current ratio is $I_{DS/on}/I_{DS/off}$, where $V_{GS/off}$, $V_{GS/on}$ at a given $V_{DS}$. The $I_{DS/on}$ is $I_{DS}$ at switched-off. The $I_{DS/on}$ is $I_{DS}$ at switched-on. The $V_{DS/off}$ is $V_{DS}$ at switched-off. The $V_{DS/on}$ is $V_{DS}$ at switched-on.

According to example embodiments, a carbon nanotube dispersion includes: a polythiophene derivative; and carbon nanotubes, wherein the polythiophene derivative includes a thiophene ring linked to an alkyl group, the alkyl group containing a carbon number of 7 or greater, and the alkyl group being regioregularyl arranged.

The polythiophene derivative may be represented by Formula 1 below.

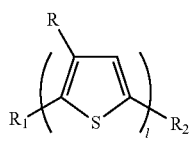

Formula 1

In Formula 1 above, R is one of a C7-C50 alkyl group, a C8-C50 alkyl group, a C7-C30 alkyl group, a C10-C30 alkyl group, but example embodiments are not limited thereto.

$R_1$ and $R_2$ are each independently one of hydrogen, halogen, alkyl, methyl, halomethyl. n is an integer greater than 1 and less than or equal to 40,000, and/or greater than 1 and less than or equal to 10,000.

The polythiophene derivative may be represented by one of Formulae 2 to 4 below:

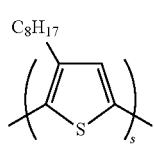

Formula 2

-continued

Formula 3

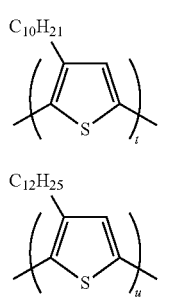

Formula 4

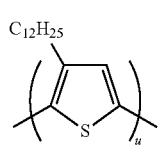

wherein s, t, and u are each independently an integer greater than 1 and less than or equal to 40,000.

When the numbers of the repeating units of the polythiophene derivatives are within the foregoing range, semiconducting carbon nanotubes may be selectively separated using an amount of such a dispersant.

The polythiophene derivative may be represented by one of Formulae 5 to 7 below:

Formula 5

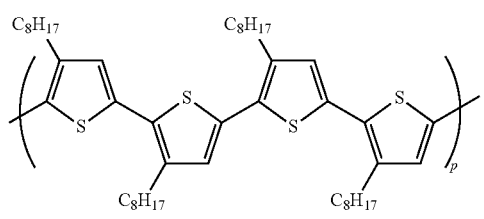

Formula 6

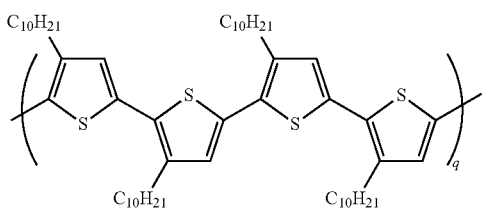

Formula 7

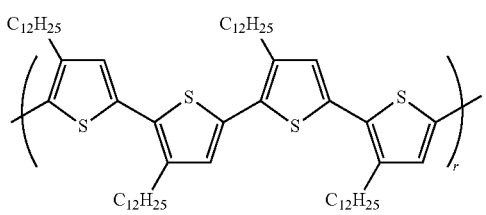

wherein p, q, and r are each independently an integer from 1 to 10,000. When the numbers of the repeating units of the polythiophene derivatives are within the foregoing range, semiconducting carbon nanotubes may be selectively separated using an amount of such a dispersant.

An amount of the semiconducting carbon nanotubes may be 75 wt % or greater of the total amount of carbon nanotubes. An amount of the semiconducting carbon nanotubes may be 99 wt % or greater, 99.5 wt % or greater, and 99.9 wt % or greater of the total amount of carbon nanotubes.

The dispersion including semiconducting carbon nanotubes may include only semiconducting carbon nanotubes with 100% and/or about 100% purity.

The polythiophene derivative may be synthesized using a McCullough method or a Rieke method. However, any suitable method that is commonly used in the art may be used to synthesize the polythiophene derivative.

Hereinafter, one or more example embodiments will be described in further detail with reference to the following examples. These examples are not intended to limit the purpose and scope of example embodiments.

EXAMPLES

Example 1

10 mg of the regioregular poly(3-octyl)thiophene (available from Sigma-Aldrich Co.) dispersant was dissolved in 25 mL of toluene, and 5 mg of single-walled carbon nanotubes (HiPCO SWNT, available from Unidym) was added into the solution to obtain a mixed solution. The single-walled carbon nanotubes were dispersed at 50° C. in a sonic bath for 30 minutes with 70% of the maximum amplitude to obtain a dispersion including metallic single-walled carbon nanotubes and semiconducting single-walled carbon nanotubes.

The resulting dispersion was centrifuged at about 25,000 G for 2 hours to isolate a supernatant, which was used as a carbon nanotube dispersion including semiconducting single-walled carbon nanotubes.

Example 2

A carbon nanotube dispersion including semiconducting single-walled carbon nanotubes was prepared in the same manner as in Example 1, except that the single-walled carbon nanotubes were dispersed at −40° C.

Example 3

A carbon nanotube dispersion including semiconducting single-walled carbon nanotubes was prepared in the same manner as in Example 1, except that the single-walled carbon nanotubes were dispersed at −30° C.

Example 4

A carbon nanotube dispersion including semiconducting single-walled carbon nanotubes was prepared in the same manner as in Example 1, except that the single-walled carbon nanotubes were dispersed at 15° C.

Example 5

A carbon nanotube dispersion including semiconducting single-walled carbon nanotubes was prepared in the same manner as in Example 1, except that the single-walled carbon nanotubes were dispersed at 20° C.

Example 6

A carbon nanotube dispersion including semiconducting single-walled carbon nanotubes was prepared in the same manner as in Example 1, except that the single-walled carbon nanotubes were dispersed at 40° C.

Example 7

A carbon nanotube dispersion including semiconducting single-walled carbon nanotubes was prepared in the same manner as in Example 1, except that the single-walled carbon nanotubes were dispersed at 60° C.

Example 8

A carbon nanotube dispersion including semiconducting single-walled carbon nanotubes was prepared in the same manner as in Example 1, except that the single-walled carbon nanotubes were dispersed at 70° C.

Example 9

A carbon nanotube dispersion including semiconducting single-walled carbon nanotubes was prepared in the same manner as in Example 1, except that the single-walled carbon nanotubes were dispersed at 90° C.

Example 10

A carbon nanotube dispersion including semiconducting single-walled carbon nanotubes was prepared in the same manner as in Example 1, except that a regioregular poly(3-decyl)thiophene (available from Sigma-Aldrich Co.) dispersant was used to obtain a dispersion including metallic single-walled carbon nanotubes and semiconducting single-walled carbon nanotubes, which was then centrifuged to obtain the carbon nanotube dispersion including semiconducting single-walled carbon nanotubes.

Example 11

A carbon nanotube dispersion including semiconducting single-walled carbon nanotubes was prepared in the same manner as in Example 10, except that the single-walled carbon nanotubes were dispersed at −40° C.

Example 12

A carbon nanotube dispersion including semiconducting single-walled carbon nanotubes was prepared in the same manner as in Example 10, except that the single-walled carbon nanotubes were dispersed at −30° C.

Example 13

A carbon nanotube dispersion including semiconducting single-walled carbon nanotubes was prepared in the same manner as in Example 10, except that the single-walled carbon nanotubes were dispersed at 15° C.

Example 14

A carbon nanotube dispersion including semiconducting single-walled carbon nanotubes was prepared in the same manner as in Example 10, except that the single-walled carbon nanotubes were dispersed at 20° C.

Example 15

A carbon nanotube dispersion including semiconducting single-walled carbon nanotubes was prepared in the same manner as in Example 10, except that the single-walled carbon nanotubes were dispersed at 40° C.

Example 16

A carbon nanotube dispersion including semiconducting single-walled carbon nanotubes was prepared in the same manner as in Example 10, except that the single-walled carbon nanotubes were dispersed at 60° C.

Example 17

A carbon nanotube dispersion including semiconducting single-walled carbon nanotubes was prepared in the same manner as in Example 10, except that the single-walled carbon nanotubes were dispersed at 70° C.

Example 18

A carbon nanotube dispersion including semiconducting single-walled carbon nanotubes was prepared in the same manner as in Example 10, except that the single-walled carbon nanotubes were dispersed at 90° C.

Example 19

A carbon nanotube dispersion including semiconducting single-walled carbon nanotubes was prepared in the same manner as in Example 1, except that a regioregular poly(3-dodecyl)thiophene (available from Sigma-Aldrich Co.) dispersant was used to obtain a dispersion including metallic single-walled carbon nanotubes and semiconducting single-walled carbon nanotubes, which was then centrifuged to obtain the carbon nanotube dispersion including semiconducting single-walled carbon nanotubes.

Example 20

A carbon nanotube dispersion including semiconducting single-walled carbon nanotubes was prepared in the same manner as in Example 19, except that the single-walled carbon nanotubes were dispersed at −40° C.

Example 21

A carbon nanotube dispersion including semiconducting single-walled carbon nanotubes was prepared in the same manner as in Example 19, except that the single-walled carbon nanotubes were dispersed at −30° C.

Example 22

A carbon nanotube dispersion including semiconducting single-walled carbon nanotubes was prepared in the same manner as in Example 19, except that the single-walled carbon nanotubes were dispersed at 15° C.

Example 23

A carbon nanotube dispersion including semiconducting single-walled carbon nanotubes was prepared in the same manner as in Example 19, except that the single-walled carbon nanotubes were dispersed at 20° C.

Example 24

A carbon nanotube dispersion including semiconducting single-walled carbon nanotubes was prepared in the same manner as in Example 19, except that the single-walled carbon nanotubes were dispersed at 40° C.

Example 25

A carbon nanotube dispersion including semiconducting single-walled carbon nanotubes was prepared in the same manner as in Example 19, except that the single-walled carbon nanotubes were dispersed at 60° C.

Example 26

A carbon nanotube dispersion including semiconducting single-walled carbon nanotubes was prepared in the same manner as in Example 19, except that the single-walled carbon nanotubes were dispersed at 70° C.

Example 27

A carbon nanotube dispersion including semiconducting single-walled carbon nanotubes was prepared in the same manner as in Example 19, except that the single-walled carbon nanotubes were dispersed at 90° C.

Comparative Example 1

A carbon nanotube dispersion including semiconducting single-walled carbon nanotubes was prepared in the same manner as in Example 1, except that a regioregular poly(3-hexyl)thiophene (available from Sigma-Aldrich Co.) dispersant was used to obtain a dispersion including metallic single-walled carbon nanotubes and semiconducting single-walled carbon nanotubes, which was then centrifuged to obtain the carbon nanotube dispersion including semiconducting single-walled carbon nanotubes.

Comparative Example 2

A carbon nanotube dispersion including semiconducting single-walled carbon nanotubes was prepared in the same manner as in Example 1, except that a poly(3,3'''-didodecyl-quarter-thiophene)(available from Sigma-Aldrich Co.) dispersant represented by Formula 8 below was used to obtain a dispersion including metallic single-walled carbon nanotubes and semiconducting single-walled carbon nanotubes, which was then centrifuged to obtain the carbon nanotube dispersion including semiconducting single-walled carbon nanotubes.

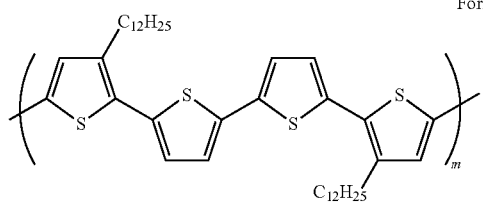

Formula 8 wherein m is an integer from 50 to 500.

Comparative Example 3

A carbon nanotube dispersion including semiconducting single-walled carbon nanotubes was prepared in the same manner as in Example 1, except that a regioregular poly(3-methyl-4-decyl-thiophene-2,5-diyl)(available from Sigma-Aldrich Co.) dispersant represented by Formula 9 below was used to obtain a dispersion including metallic single-walled carbon nanotubes and semiconducting single-walled carbon nanotubes, which was then centrifuged to obtain the carbon nanotube dispersion including semiconducting single-walled carbon nanotubes.

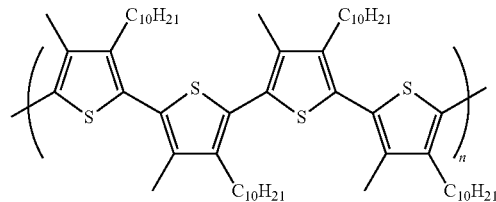

Formula 9 wherein n is an integer from 50 to 500.

CNT Separation Yield Evaluation
UV-Vis-NIR Absorption Spectra Observation

The CNT dispersions prepared in Examples 1, 10, 19-27, and Comparative Examples 1-3, including the semiconducting single-walled CNTs, were observed using an ultraviolet (UV)-visible (Vis)-near infrared (NIR) spectrometer (Varian) to read absorption peak intensities in a range of wavelengths. The results are shown in FIGS. 1, 3 and 4.

Referring to FIG. 1, which illustrates UV-Vis-NIR absorption spectra of the CNT dispersions, the CNT dispersions of Examples 1, 10 and 19 show stronger absorption peak intensities in a near infrared (NIR) range of 750 nm to 1500 nm, than those of Comparative Examples 1 to 3, indicating that the CNT dispersions of Examples 1, 10 and 19 include remarkably larger amounts of semiconducting CNTs.

Figure 3:
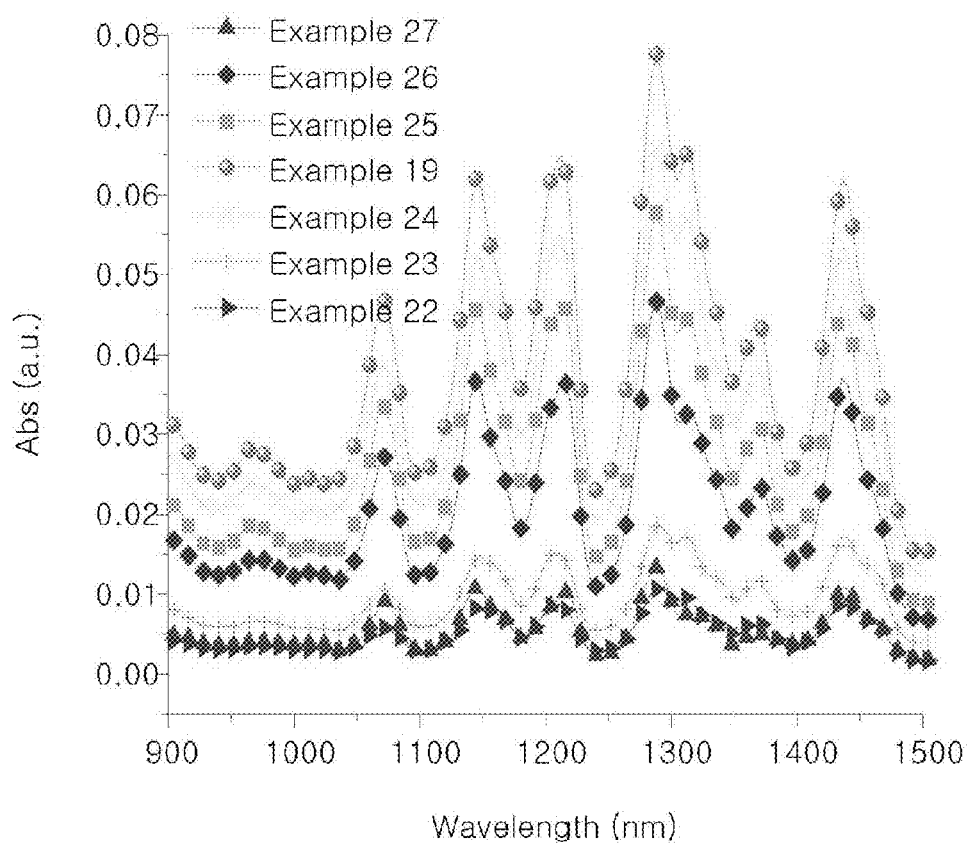
FIG. 3 is a 2-dimensional (2D) graph of UV-Vis-NIR absorption spectra of supernatants isolated in Examples 19, and 22 to 27.
Figure 4:
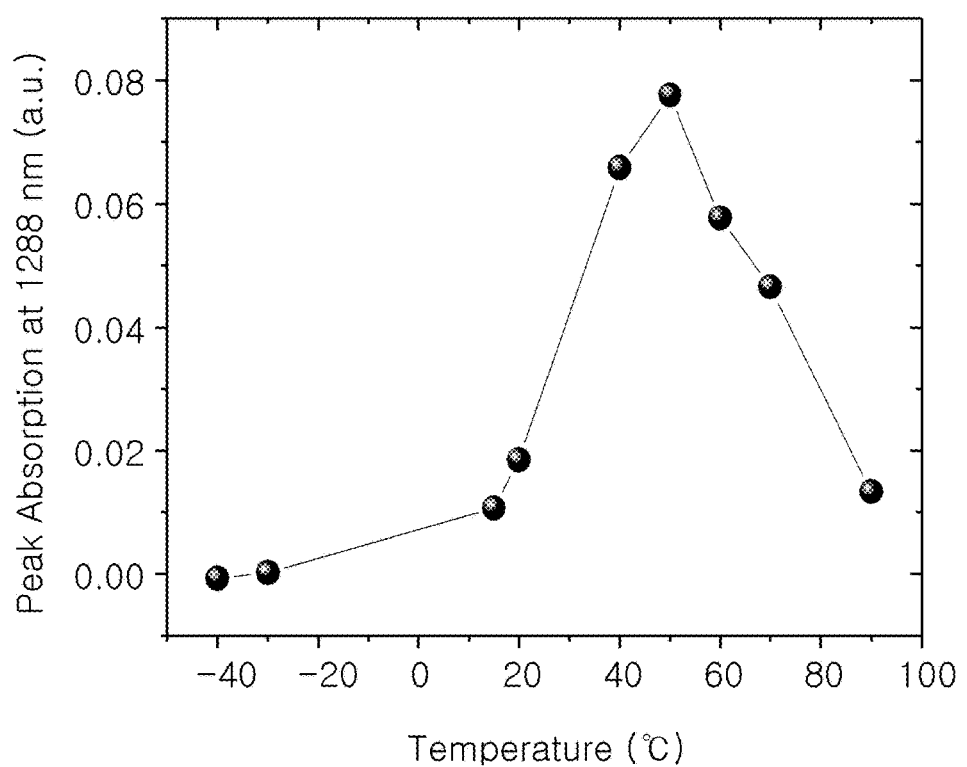
FIG. 4 is a 2D graph of absorbances of the supernatants isolated in Examples 19-27 at 1288 nm.

Referring to FIGS. 3 and 4, the semiconductor dispersions of Examples 19-27 prepared via the dispersing of the mixed solutions of the polythiophene derivatives, the CNTs, and the solvents at a temperature of −40° C. to 90° C., include large amounts of semiconducting CNTs. FIG. 3 is a 2-dimensional (2D) graph of UV-Vis-NIR absorption spectra of supernatants isolated in Examples 19, and 22 to 27. FIG. 4 is a 2D graph of absorbances of the supernatants isolated in Examples 19-27 at 1288 nm.

Raman Spectra Observation by Raman Spectroscopy

Raman spectra in a radial breathing mode (RBM) of the CNT dispersion of Example 19 before centrifugation and a supernatant thereof obtained after the centrifugation at 25,000 G for 2 hours were observed using a Raman spectrometer (T.Y. Horriba) at different excitation energies of 2.33 eV (532 nm), 1.94 eV (633 nm), and 1.59 eV (785 nm). The results are shown in FIGS. 5 to 7.

Figure 5:
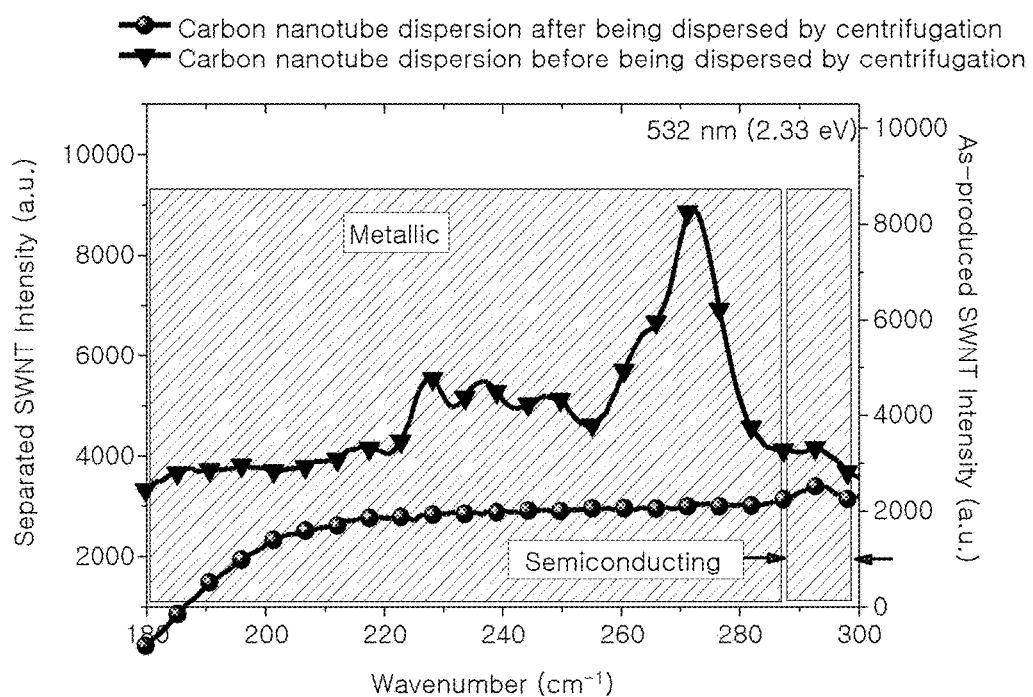
FIG. 5 is a graph of Raman spectra of the CNT dispersion of Example 19 before and after centrifugation observed at an excitation energy of 2.33 eV (532 nm)

Referring to FIG. 5, which illustrates RBM spectra in a region of 180 $cm^{-1}$ to 285 $cm^{-1}$ when excited at 2.33 eV (532 nm), resonance peaks of metallic single-walled CNTs appear in the dispersion before centrifugation. However, the resonance peaks of metallic CNTs disappear in the supernatant isolated from the dispersion by centrifugation.

Figure 6:
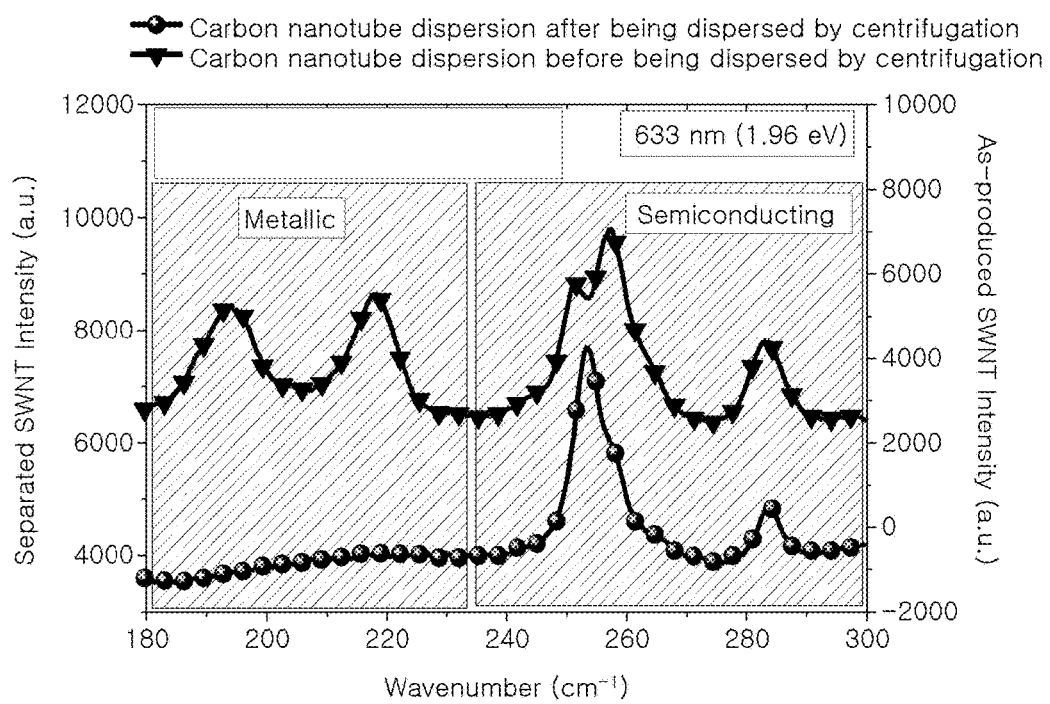
FIG. 6 is a graph of Raman spectra of the CNT dispersion of Example 19 before and after centrifugation observed at an excitation energy of 1.96 eV (633 nm)
Figure 7:
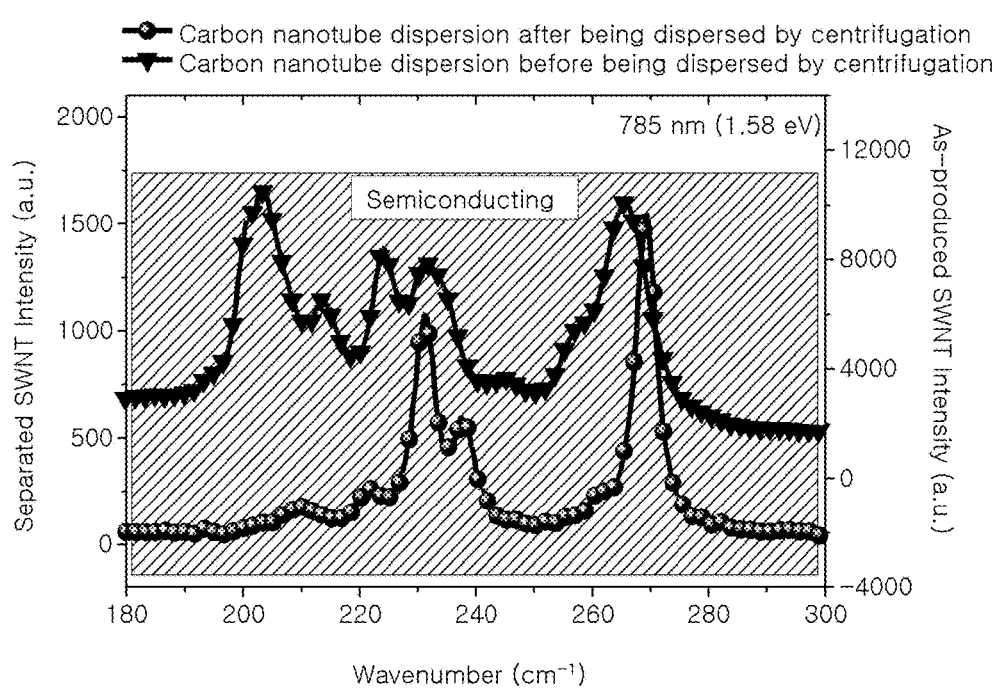
FIG. 7 is a graph of Raman spectra of the CNT dispersion of Example 19 before and after centrifugation observed at an excitation energy of 1.58 eV (785 nm)

Referring to FIG. 6, which illustrates RBM spectra in a region of 180 $cm^{-1}$ to 285 $cm^{-1}$ when excited at 1.94 eV (633 nm), resonance peaks of metallic CNTs and semiconducting CNTs appear in the dispersion before centrifugation, whereas the resonance peaks of metallic CNTs disappear in the supernatant isolated from the dispersion by centrifugation.

The resonance peaks of semiconducting CNTs mostly remain in a region of 240 $cm^{-1}$ to 285 $cm^{-1}$ in which resonance peaks of nonmetallic CNTs normally appear.

Referring to FIG. 7, which illustrates RBM spectra in a region of 180 $cm^{-1}$ to 285 $cm^{-1}$ when excited at 1.59 eV (785 nm), resonance peaks of only semiconducting CNTs appear in the dispersion before centrifugation, whereas the resonance peaks of semiconducting CNTs remain in the supernatant isolated from the dispersion by centrifugation.

Based on this result, it is understood that the supernatant obtained after centrifugation include semiconducting single-walled CNTs with a high yield such as about 100%, excluding the metallic CNTs, which were almost completely removed from the supernatant by the centrifugation.

Evaluation Comparison of Hole Mobility and on/Off Current Ratio of TFTs

A TFT was manufactured with a Pt source electrode, a Ti drain electrode, and a gate electrode (heavily n-doped Si substrate), and a $SiO_2$ dielectric layer (having a thickness of 300 nm).

A surface of the $SiO_2$ insulating layer was modified to have a self-assembled monolayer (SAM) including an amine terminal group. CNTs, which were randomly disposed between the source electrode and the drain electrode, had an average length of 1.0 μm±0.1 μm, as observed by scanning electron microscopy (SEM). The CNTs were used to form a channel between the source electrode and the drain electrode. The CNT channel included less than fifty (>50) CNTs per $mm^2$ on average, and had a thickness of about 2.3 nm.

Referring to FIGS. 9 and 10, based on the voltage levels of the gate electrode and the current levels of the drain electrode, the TFT is found to have a hole mobility of 10 $cm^2/Vs$ or greater, and an on/off current ratio of $10^6$ or greater.

As described above, according to example embodiments, a method of selective separation of semiconducting CNTs enables semiconducting CNTs to be separated easily with a high yield, and an electronic device including semiconducting CNTs separated by using the method may have improved electrical characteristics.

Solar Cells

Figure 11A:
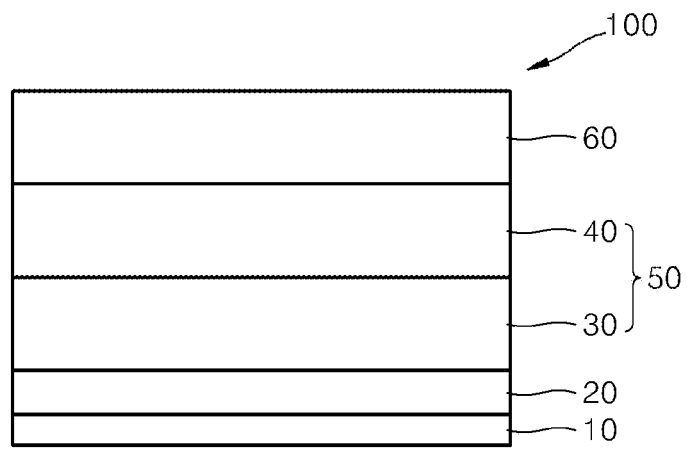
FIGS. 11A and 11B are schematic views of solar cells according to example embodiments.
Figure 11B:
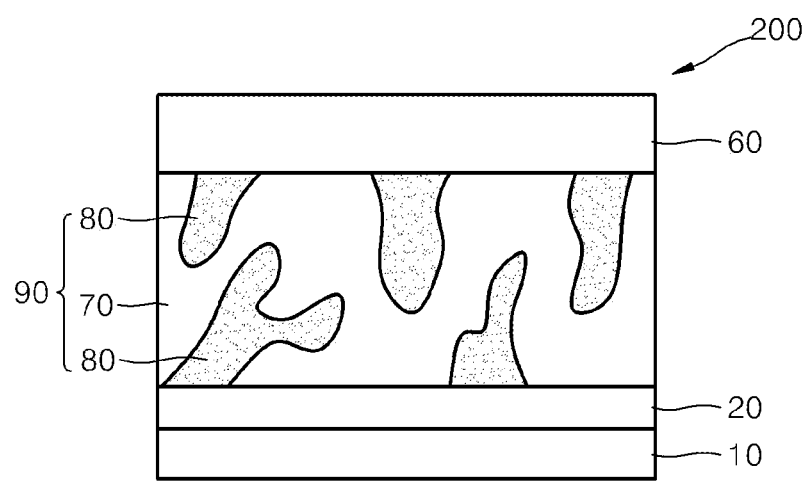

FIGS. 11A and 11B are schematic views of solar cells according to example embodiments.

Referring to FIG. 11A, a solar cell 100 according to example embodiments may include a substrate 10, lower electrode 20, photoactive layer 50, and an upper electrode 60 sequentially stacked. The material of the substrate 10 may include one of non-conductive polymers, silicon, glass, fused silica, quartz, plastics, polydimethylsiloxane (PDMS), and combinations thereof, but example embodiments are not limited thereto. The lower electrode 20 and upper electrode 60 each may include at least one transparent conductive oxide material, such as zinc oxide, tin oxide, indium tin oxide, and the like, but example embodiments are not limited thereto. The material and/or materials of the lower electrode 20 and the upper electrode 60 may be the same or different. The photoactive layer 50 includes a n-type layer 30 and a p-type layer 40. The p-type layer 40 may include a dispersion containing semiconducting carbon nanotubes according to example embodiments. The semiconducting CNTs may be used as a charge generation in solar cells. Further, the semiconducting CNTs may be used to facilitate a charge transport, according to the characteristics of the CNTs. The polythiophene derivative can be used as an electron donor.

Referring FIG. 11B, a solar cell 200 according to example embodiments may be similar to the solar cell 100 in FIG. 11A, except the photoactive layer 90 includes a mixture of p-type material 80 and n-type material 70. The discussion of like structural elements between solar cells 100 and 200 will be omitted. The p-type layer 80 may include a dispersion containing semiconducting carbon nanotubes according to example embodiments.

While some example embodiments have been particularly shown and described, it will be understood by one of ordinary skill in the art that variations in form and detail may be made therein without departing from the spirit and scope of the claims.

What is claimed is:

1. A dispersion comprising:
a polythiophene derivative; and
semiconducting carbon nanotubes,
wherein the polythiophene derivative includes
a thiophene ring linked to an alkyl group,
the alkyl group containing a carbon number of greater than 8, and the alkyl group being regioregularly arranged,
wherein the polythiophene derivative includes a structure represented by Formula 1 below:

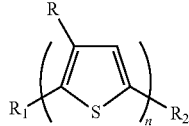

Formula 1 wherein R is the alkyl group and n is an integer greater than 1 and less than or equal to 40,000,
R is a C9 to C50 alkyl group,
$R_1$ and $R_2$ are each independently one of hydrogen, halogen, methyl, and halomethyl, and
wherein an amount of the semiconducting carbon nanotubes is 75 wt % or greater of a total amount of carbon nanotubes.

2. The dispersion of claim 1, wherein the polythiophene derivative is represented by one of Formulae 3 and 4 below:

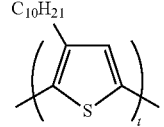

Formula 3

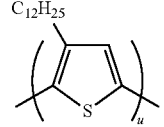

Formula 4 wherein t and u are each independently an integer greater than 1 and less than or equal to 40,000.

3. An electronic device comprising:
a layer including the dispersion of claim 2.

4. The dispersion of claim 1, wherein the polythiophene derivative is represented by one of Formulae 6 and 7 below:

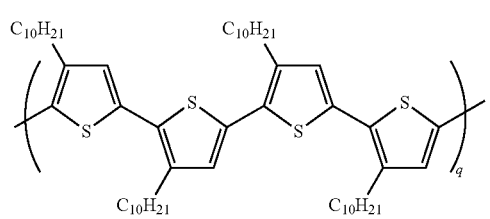

Formula 6

Formula 7

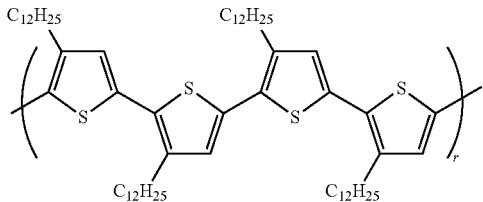

wherein q and r are each independently an integer from 1 to 10,000.

5. An electronic device comprising:
a layer including the dispersion of claim 4.

6. The dispersion of claim 1, wherein the amount of the semiconducting carbon nanotubes is 99 wt % or greater of the total amount of carbon nanotubes.

7. The dispersion of claim 1, wherein the amount of the semiconducting carbon nanotubes is 99.9 wt % or greater of the total amount of carbon nanotubes.

8. The dispersion of claim 1, wherein the amount of the semiconducting carbon nanotubes is 99 wt % or greater of the total amount of carbon nanotubes.

9. An electronic device comprising:
a layer including the dispersion of claim 8.

10. The dispersion of claim 1, wherein the amount of the semiconducting carbon nanotubes is 99.5 wt % or greater of the total amount of carbon nanotubes.

11. An electronic device comprising:
a layer including the dispersion of claim 10.

12. An electronic device comprising:
a layer including the dispersion of claim 1.

13. The electronic device of claim 12, wherein the electronic device includes one of a transistor, a solar cell, a photodetector, a photoconductor, an electrode, and a flexible electronic device.

14. The electronic device of claim 12, wherein the electronic device comprises a thin film transistor (TFT), wherein the thin film transistor has a hole mobility of 10 $cm^2$/Vs or greater and an on/off current ratio of $10^6$ or greater.

* * * * *